US007880201B2

(12) United States Patent
Vlasov et al.

(10) Patent No.: US 7,880,201 B2
(45) Date of Patent: Feb. 1, 2011

(54) OPTICAL MODULATOR USING A SERPENTINE DIELECTRIC LAYER BETWEEN SILICON LAYERS

(75) Inventors: Yurii A. Vlasov, Katonah, NY (US); Fengnian Xia, Plainsboro, NJ (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 11/558,289

(22) Filed: Nov. 9, 2006

(65) Prior Publication Data

US 2008/0112032 A1    May 15, 2008

(51) Int. Cl.
*H01L 29/66*    (2006.01)
*H01L 29/06*    (2006.01)
*H01L 31/0352*    (2006.01)
*H03C 3/00*    (2006.01)

(52) U.S. Cl. .................. 257/212; 257/104; 257/105; 257/106; 257/618; 257/653; 257/654; 257/E31.038; 257/E31.039; 257/E29.006; 257/E29.022; 257/E29.024; 257/E29.025; 332/144; 332/146

(58) Field of Classification Search .............. 359/279; 332/144–146; 385/3, 132; 257/212, 618, 257/653–654, 431, 461, 464, 622, E31.038–E31.039, 257/E29.02, 466, 465, E29.006, E29.022, 257/E29.024–E29.025, 104–106; 438/386, 438/388, 389, 391
See application file for complete search history.

(56) References Cited

U.S. PATENT DOCUMENTS 4,997,246 A    3/1991 May et al.
5,488,010 A *  1/1996 Wong ................. 438/75
5,901,265 A *  5/1999 Tohyama et al. ....... 385/131
6,153,463 A * 11/2000 Wei et al. ............. 438/253
6,845,198 B2   1/2005 Montgomery et al.
6,912,079 B2 * 6/2005 Liu ..................... 359/279
2002/0094635 A1* 7/2002 Hirler et al. ............ 438/242
2005/0158002 A1* 7/2005 Kubby et al. ........... 385/129
2007/0292073 A1* 12/2007 Li ........................ 385/14

FOREIGN PATENT DOCUMENTS

CN    1787173    6/2006
CN    1828867    9/2006

OTHER PUBLICATIONS

Liu, et al, "A high-speed silicon optical modulator based on a metal-oxide-semiconductor capacitor," Nature 427, 615-618 (2004).
Q. Xu, et al, "Micrometer-scale silicon electro-optic modulator," Nature 435, 325-327 (2005).
L. Liao, et al, "High speed silicon Mach-Zehnder modulator," Opt. Express, 13, 3129-3145 (2005).
L. Liao, et al, "Phase modulation efficiency and transmission loss of silicon optical phase shifters," IEEE J. Quantum Electron., 41, 250-257, (2006).
Q. Xu, et al. Experimental demonstration of guiding and confining light in nanometer-size low-refractive-index material, Opt. Lett., 29, 1626-1628, (2004).

* cited by examiner

*Primary Examiner*—Phat X Cao
*Assistant Examiner*—Diana C Garrity

(57) ABSTRACT

The present invention is a method and an apparatus for optical modulation, for example for use in optical communications links. In one embodiment, an apparatus for optical modulation includes a first silicon layer having one or more trenches formed therein, a dielectric layer lining the first silicon layer, and a second silicon layer disposed on the dielectric layer and filling the trenches.

16 Claims, 2 Drawing Sheets

OPTICAL MODULATOR USING A SERPENTINE DIELECTRIC LAYER BETWEEN SILICON LAYERS

BACKGROUND

The invention relates generally to optical communications, and relates more particularly to modulators used in optical communications links.

In any optical communication link, there are three major components: a light source that generates light, a modulator that encodes the light, and a photodiode that detects the light. Silicon has recently been considered as a material for use in modulators for optical communications links; however, to date, such silicon modulators have been characterized by drawbacks such as large device footprints and/or limited modulation bandwidth and optical bandwidth.

FIG. 1 is a cross-sectional view illustrating a portion of a conventional metal-oxide-semiconductor (MOS) capacitor 100. Specifically, the capacitor 100 comprises a first silicon layer 102 and a second silicon layer 108 having a gate oxide layer 104 disposed therebetween. A phase shift is induced in the optical mode of light propagating through the capacitor 100 when the refractive index of the silicon is modified, e.g., due to a surface charge produced by applied voltage (manifested in carriers $106_1$-$106_n$, hereinafter collectively referred to as "carriers 106").

For example, as a surface charge is produced (e.g., by accumulation or inversion), the effective index of the optical mode decreases due to reduced material index of the silicon in the surface charge region (i.e., the region in which the carriers 106 are produced). Because the thickness of the surface charge region is very thin (e.g., in the range of tens of nanometers), the overlap between the optical mode of the waveguide and the surface charge region is very small, leading to very limited effective index variation of the waveguiding mode. Hence, in order to induce sufficient accumulative phase change, the capacitor 100 must adopt a very long length.

Thus, there is a need for a method and an apparatus for optical modulation.

SUMMARY OF THE INVENTION

The present invention is a method and an apparatus for optical modulation, for example for use in optical communications links. In one embodiment, an apparatus for optical modulation includes a first silicon layer having one or more trenches formed therein, a dielectric layer lining the first silicon layer, and a second silicon layer disposed on the dielectric layer and filling the trenches.

BRIEF DESCRIPTION OF THE DRAWINGS

So that the manner in which the above recited embodiments of the invention are attained and can be understood in detail, a more particular description of the invention, briefly summarized above, may be obtained by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

In one embodiment, the present invention is a method and apparatus for optical modulation. Embodiments of the present invention enable enhanced optical confinement within a smaller device (modulator) footprint, by providing an enlarged surface charge region (i.e., comprising both "horizontal" and "vertical" portions). When combined with a highly confined mode profile, the footprint of the modulator can be even further reduced.

Figure 1:
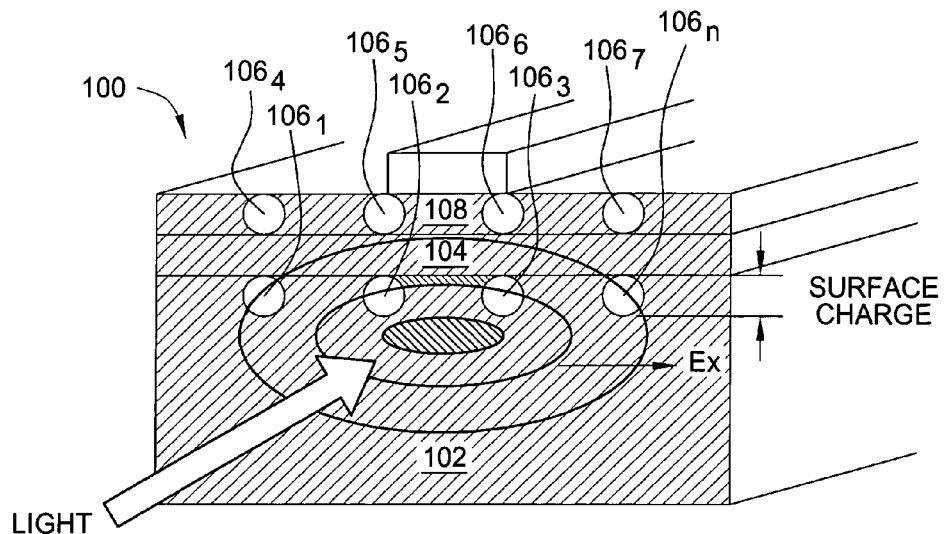
FIG. 1 is a cross-sectional view illustrating a portion of a conventional metal-oxide-semiconductor (MOS) capacitor.
Figure 2:
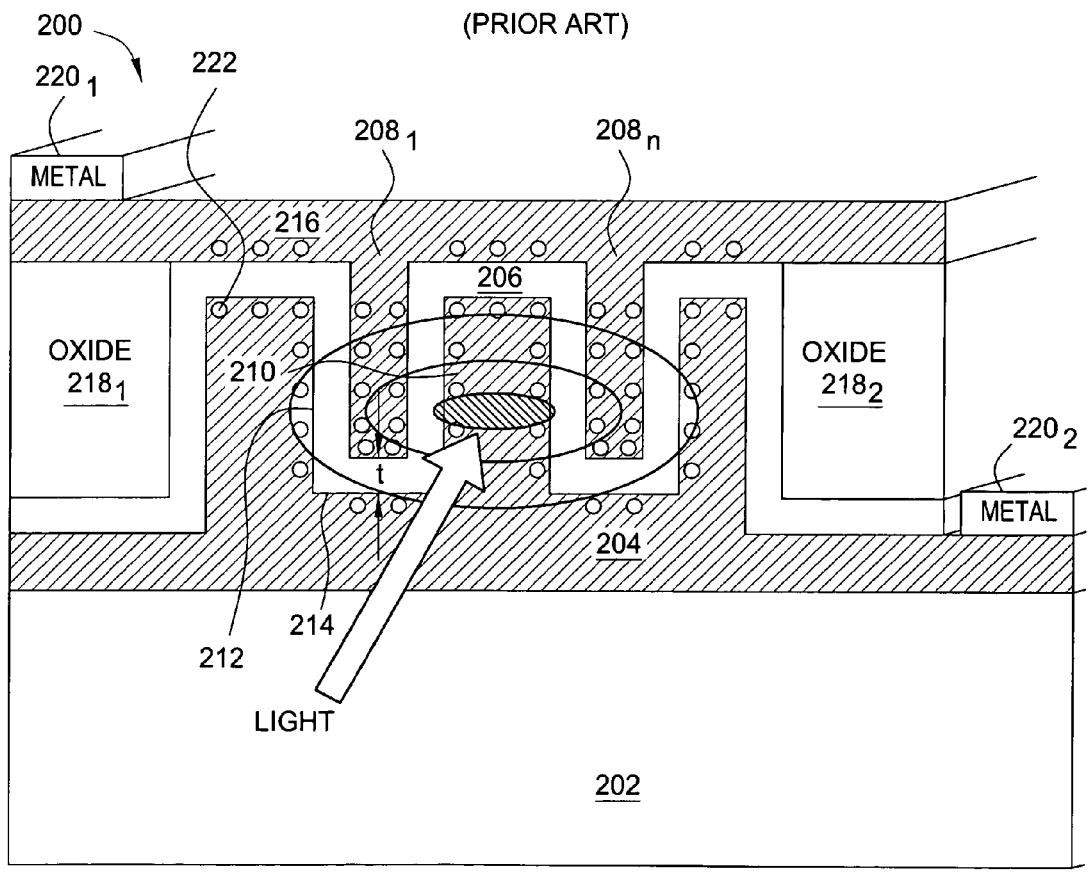
FIG. 2 is a cross-sectional view illustrating one embodiment of a capacitor that may be implemented for use in an optical communication link, according to the present invention.

FIG. 2 is a cross-sectional view illustrating one embodiment of a capacitor 200 that may be implemented for use in an optical communication link, according to the present invention. Specifically, the capacitor 200 may be used in a modulator (e.g., a Mach-Zehnder interferometer-based modulator) of an optical communications link. The capacitor 200 shares some similarities with the capacitor 100 illustrated in FIG. 1 and comprises a buried oxide layer 202, a first silicon layer 204, a dielectric layer 206 and a second silicon layer 216.

The first silicon layer 204 is disposed on the buried oxide layer 202. The first silicon layer 204 comprises one or more trenches $208_1$-$208_n$ (hereinafter collectively referred to as "trenches 208") formed therein. Taking trench $208_1$ of FIG. 2 as an example, each trench comprises a first wall 210, a second wall 212 and a third wall 214. The first wall 210 and the second wall 212 are substantially parallel to each other, while the third wall 214 is substantially perpendicular to the first wall 210 and the second wall 212.

The dielectric layer 206 is disposed on the first silicon layer 204. In one embodiment, the dielectric layer 206 has a substantially zigzag or serpentine-shaped cross section (i.e., relative to the direction of the propagation of light through the capacitor 200), such that the dielectric layer 206 lines the trenches 208 in the first silicon layer 204. Thus, the dielectric layer 206 can be considered to comprise both a "horizontal" portion (i.e., a portion that is substantially parallel to the buried oxide layer 202, such as the third wall 214 and walls of other trenches 208 that are substantially parallel thereto) and a "vertical" portion (i.e., a portion that is substantially perpendicular to the buried oxide layer 202, such as the first wall 210, the second wall 212 and walls of other trenches 208 that are substantially parallel thereto).

In one embodiment, the dielectric layer 206 comprises a layer of material having a thickness, t, which is as thin as possible but remains capable of sustaining a voltage that is high enough to produce a surface charge (e.g., ten Volts). Thus, in one embodiment, the thickness, t, of the dielectric layer 206 ranges from a few nanometers to tens of nanometers. In one embodiment, the dielectric layer 206 comprises a material that has a low refractive index relative to the second silicon layer 216. In another embodiment, the dielectric layer 206 comprises a material having a refractive index lower than or approximately equal to the refractive index of the second silicon layer 216. In one embodiment, the dielectric layer 206 comprises a gate oxide. In one embodiment, the dielectric layer 206 is formed of at least one of: silicon dioxide, silicon nitride or a high-k dielectric (i.e., a material with a high dielectric constant).

The second silicon layer 216 is disposed on the dielectric layer 206 and fills the trenches 208 that are lined by the dielectric layer 206. Thus, the second silicon layer 216 is separated from the first silicon layer 204 by the dielectric layer 206. In one embodiment, the first silicon layer 204 comprises crystalline silicon, while the second silicon layer 216 comprises polysilicon. In another embodiment, both the first silicon layer 204 and the second silicon layer 216 comprise crystalline silicon. In one embodiment, the first silicon layer 204 is n-doped, while the second silicon layer 216 is p-doped.

In one embodiment, the capacitor 200 further comprises two oxide layers $218_1$ and $218_2$ (hereinafter collectively referred to as "oxide layers 218") disposed laterally on either side of the dielectric layer 206. Thus, like the dielectric layer 206, the oxide layers 218 are disposed between the first silicon layer 204 and the second silicon layer 216. The oxide layers 218 help to maintain optical confinement and to prevent the optical field of light propagating through the capacitor 200 from penetrating into contact areas $220_1$ and $220_2$ (hereinafter collectively referred to as "contact areas 220"). The contact areas 220 are adapted to provide voltages to the capacitor 200, such that surface charge (i.e., carriers 222) accumulates on both sides of the dielectric layer 206.

Figure 3:
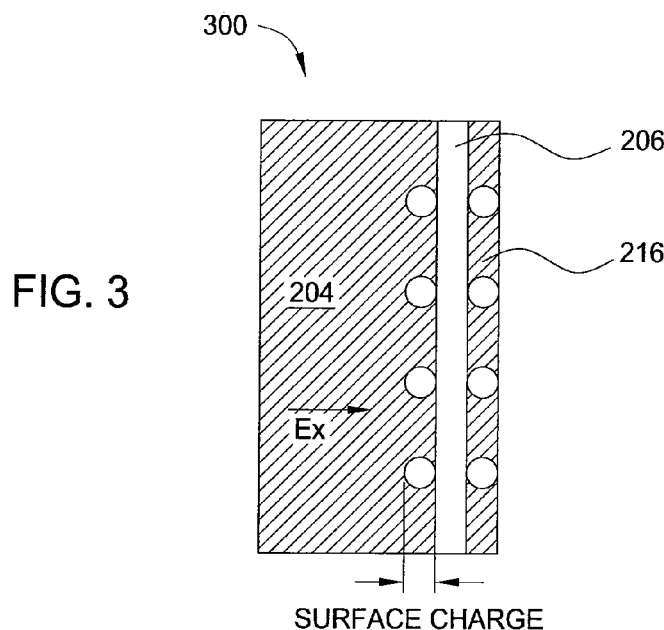
FIG. 3 is a cross-sectional view illustrating a portion of the capacitor illustrated in FIG. 2.

FIG. 3 is a cross-sectional view illustrating a portion 300 of the capacitor 200 illustrated in FIG. 2. Specifically, FIG. 3 illustrates a portion of the dielectric layer 206 that is disposed "vertically" or substantially perpendicular to the buried oxide layer 202 (e.g., such as the first wall 210 or the second wall 212 of the trench $208_1$).

In this case, where the second silicon layer 216 is assumed to comprise silicon whose refractive index is reduced from $n_{si}$ to $n_s$, the electric field amplitude increases from $E_x$ to $$\left(\frac{n_{si}^2}{n_s^2}\right)E_x$$

for the transverse electric (TE) mode (i.e., electric field in the x direction) due to the continuity of electric displacement. As a result, the energy confined in the surface charge region increases from $$\int n_{si}^2 E_x^2 dV \text{ to } \int \frac{n_{si}^4}{n_s^2} E_x^2 dV.$$

The total enhancement factor achieved by changing the orientation of a MOS structure (e.g., from "horizontal" to "vertical") is $$\frac{n_{si}^4}{n_s^2}.$$

The capacitor 200 thus allows for enhanced optical confinement within a smaller footprint. The optical confinement factor in the surface charge region is enhanced, because the serpentine cross section of the dielectric layer 206 creates an enlarged surface charge region (i.e., comprising both "horizontal" and "vertical" portions). This creates a very strong overlap of the carriers with the optical mode that propagates through the capacitor 200. This in turn allows the length of a modulator incorporating the capacitor 200 to be reduced. Combined with the highly confined mode profile in the capacitor 200 and the enhanced confinement factor of TE mode light in the surface charge region along both sides of the vertical portions of the dielectric layer 206, the footprint of the modulator can be even further reduced.

Figure 4:
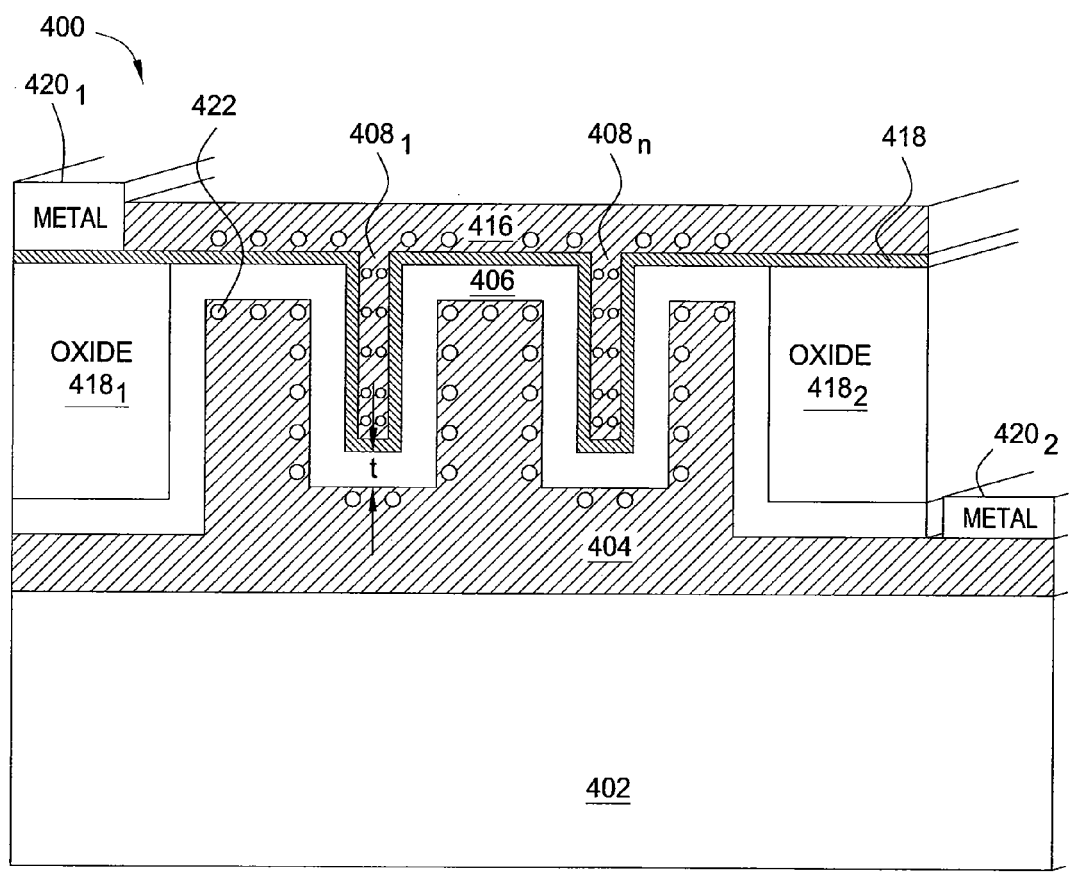
FIG. 4 is a cross-sectional view illustrating a second embodiment of a capacitor that may be implemented for use in an optical communication link, according to the present invention.

FIG. 4 is a cross-sectional view illustrating a second embodiment of a 400 that may be implemented for use in an optical communication link, according to the present invention. The capacitor 400 shares some similarities with the capacitor 200 illustrated in FIG. 2 and comprises a buried oxide layer 402, a first silicon layer 404, a dielectric layer 406 and a second silicon layer 416.

The first silicon layer 404 is disposed on the buried oxide layer 402. The first silicon layer 404 comprises one or more trenches $408_1$-$408_n$ (hereinafter collectively referred to as "trenches 408") formed therein.

The dielectric layer 406 is disposed on the first silicon layer 404. In one embodiment, the dielectric layer 406 has a substantially zigzag or serpentine-shaped cross section (i.e., relative to the direction of the propagation of light through the capacitor 400), such that the dielectric layer 406 lines the trenches 408 in the first silicon layer 404. In one embodiment, the dielectric layer 406 comprises a layer of material having a thickness, t, which is as thin as possible but remains capable of sustaining a voltage that is high enough to produce a surface charge (e.g., ten Volts). Thus, in one embodiment, the thickness, t, of the dielectric layer 406 ranges from a few nanometers to tens of nanometers. In one embodiment, the dielectric layer 406 comprises a material that has a low refractive index relative to the second silicon layer 416. In another embodiment, the dielectric layer 406 comprises a material having a refractive index lower than or approximately equal to the refractive index of the second silicon layer 416. In one embodiment, the dielectric layer 406 comprises a gate oxide. In one embodiment, the dielectric layer 406 is formed of at least one of: silicon dioxide, silicon nitride or a high-k dielectric (i.e., a material with a high dielectric constant).

The second silicon layer 416 is disposed on the dielectric layer 406 and fills the trenches 408 that are lined by the dielectric layer 406. Thus, the second silicon layer 416 is separated from the first silicon layer 404 by the dielectric layer 406. In one embodiment, the first silicon layer 404 comprises crystalline silicon, while the second silicon layer 416 comprises polysilicon. In another embodiment, both the first silicon layer 404 and the second silicon layer 416 comprise crystalline silicon. In one embodiment, the first silicon layer 404 is n-doped, while the second silicon layer 416 is undoped.

In one embodiment, the capacitor 400 further comprises two oxide layers $418_1$ and $418_2$ (hereinafter collectively referred to as "oxide layers 418") disposed laterally on either side of the dielectric layer 406. Thus, like the dielectric layer 406, the oxide layers 418 are disposed between the first silicon layer 404 and the second silicon layer 416. The oxide layers 418 help to maintain optical confinement and to prevent the optical field of light propagating through the capacitor 400 from penetrating into contact areas $420_1$ and $420_2$ (hereinafter collectively referred to as "contact areas 420"). The contact areas 420 are adapted to provide voltages to the capacitor 400, such that surface charge (i.e., carriers 422) accumulates on both sides of the dielectric layer 406.

In addition, the capacitor 400 comprises a thin layer 418 of highly p-doped material lining the dielectric layer 406, such that the layer 418 is disposed between the dielectric layer 406 and the second silicon layer 416. In one embodiment, the layer 418 comprises p-doped silicon. Thus, unlike the capacitor 200 illustrated in FIG. 2, the capacitor 400 includes an undoped region (i.e., the second silicon layer 416) disposed over a very thin p-doped region (i.e., layer 418). This conveys several advantages as compared to the capacitor 200. First, optical loss (i.e., free carrier absorption) is reduced. Free carrier absorption typically results from p-doped regions; however, since the p-doped region of the capacitor 400 is very thin, the optical losses are reduced. Second, the capacitor 400 distributes the surface charge more uniformly in both the "horizontal" and "vertical" surfaces, due to low resistivity of the highly p doped layer 218. Thus, the overlap of the charge region with the optical mode is enhanced.

Thus, the present invention represents a significant advancement in the field of photonics. Embodiments of the invention may be effectively implemented in optical communications links to enhance optical confinement while reducing device (modulator) footprint, by providing an enlarged surface charge region (i.e., comprising both "horizontal" and "vertical" portions). Combined with a highly confined mode profile and an enhanced surface charge region utilizing a zigzag shaped dielectric layer, the footprint of the modulator can be even further reduced.

While foregoing is directed to the preferred embodiment of the present invention, other and further embodiments of the invention may be devised without departing from the basic scope thereof, and the scope thereof is determined by the claims that follow.

The invention claimed is:

1. Apparatus comprising:
a first silicon layer, the first silicon layer having a plurality of trenches formed therein, wherein the first silicon layer is n-doped;
a dielectric layer lining the first silicon layer, wherein a cross section of the dielectric layer relative to a direction of propagation of light through the apparatus comprises a substantially serpentine shape;
a second silicon layer disposed on the dielectric layer and filling the one or more trenches, wherein the second silicon layer is undoped; and
a layer of p-doped silicon disposed between the dielectric layer and the second silicon layer, the layer of p-doped silicon lining the dielectric layer, wherein the layer of p-doped silicon is thinner than the second silicon layer.

2. The apparatus of claim 1, wherein the first silicon layer comprises crystalline silicon.

3. The apparatus of claim 1, wherein the dielectric layer comprises a gate oxide.

4. The apparatus of claim 3, wherein the gate oxide comprises silicon dioxide.

5. The apparatus of claim 3, wherein the gate oxide comprises silicon nitride.

6. The apparatus of claim 3, wherein the gate oxide comprises a high-k dielectric.

7. The apparatus of claim 1, wherein a refractive index of the dielectric layer is less than a refractive index of the second silicon layer.

8. The apparatus of claim 1, wherein the second silicon layer comprises crystalline silicon.

9. The apparatus of claim 1, further comprising:
a first oxide layer disposed laterally relative to a first side of the dielectric layer, such that the first oxide layer is positioned between the first silicon layer and the second silicon layer; and
a second oxide layer disposed laterally relative to a second side of the dielectric layer, such that the second oxide layer is positioned between the first silicon layer and the second silicon layer,
wherein the first oxide layer and the second oxide layer are spaced apart relative to each other by a section of the dielectric layer residing between the first side of the dielectric layer and the second side of the dielectric layer.

10. The apparatus of claim 1, wherein a refractive index of the dielectric layer is approximately equal to a refractive index of the second silicon layer.

11. The apparatus of claim 1, wherein the second silicon layer comprises polysilicon.

12. The apparatus of claim 1, wherein the cross section of the dielectric layer comprises a surface charge region.

13. The apparatus of claim 12, wherein the surface charge region comprises a plurality of horizontal portions and a plurality of vertical portions.

14. The apparatus of claim 12, wherein the surface charge region overlaps with a region through which an optical mode propagates through the apparatus.

15. The apparatus of claim 1, wherein the first silicon layer is disposed directly on a buried oxide layer.

16. The apparatus of claim 15, wherein the second silicon layer is separated from the buried oxide layer by the first silicon layer, the dielectric layer, and the layer of p-doped silicon.

* * * * *